(12) United States Patent
Lamouroux et al.

(10) Patent No.: US 8,163,088 B2
(45) Date of Patent: Apr. 24, 2012

(54) METHOD OF DENSIFYING THIN POROUS SUBSTRATES BY CHEMICAL VAPOR INFILTRATION, AND A LOADING DEVICE FOR SUCH SUBSTRATES

(75) Inventors: Franck Lamouroux, Le Taillan Medoc (FR); Sébastien Bertrand, Moulis-en-Medoc (FR); Stéphane Goujard, Erignac (FR); Alain Caillaud, Saint Caprais de Bordeaux (FR); Francis Bagilet, Tresses (FR); Stéphane Mazereau, Saint Aubin de Medoc (FR)

(73) Assignee: Snecma Propulsion Solide, Le Haillan (FR)

( * ) Notice: Subject to any disclaimer, the term of this patent is extended or adjusted under 35 U.S.C. 154(b) by 883 days.

(21) Appl. No.: 11/884,597

(22) PCT Filed: Feb. 16, 2006

(86) PCT No.: PCT/FR2006/050141
§ 371 (c)(1), (2), (4) Date: Feb. 26, 2008

(87) PCT Pub. No.: WO2006/087495
PCT Pub. Date: Aug. 24, 2006

(65) Prior Publication Data
US 2008/0152803 A1    Jun. 26, 2008

(30) Foreign Application Priority Data

Feb. 17, 2005   (FR) ....................................... 05 01615

(51) Int. Cl.
*C23C 16/455* (2006.01)
*C23C 16/458* (2006.01)
*C23C 16/06* (2006.01)
*C23C 16/22* (2006.01)

(52) U.S. Cl. ............... 118/715; 156/345.33; 156/345.51

(58) Field of Classification Search .................. 118/715, 118/728; 156/345.33, 345.51
See application file for complete search history.

(56) References Cited

U.S. PATENT DOCUMENTS

| | | | | | |
|---|---|---|---|---|---|
| 3,492,097 | A | * | 1/1970 | Moles et al. .................. | 422/109 |
| 3,696,779 | A | * | 10/1972 | Murai et al. .................. | 118/725 |
| 3,783,822 | A | * | 1/1974 | Wollam ........................ | 118/725 |
| 4,047,496 | A | * | 9/1977 | McNeilly et al. ............. | 118/725 |
| 4,207,137 | A | * | 6/1980 | Tretola ........................... | 438/10 |

(Continued)

FOREIGN PATENT DOCUMENTS

EP           1 285 976           2/2003

(Continued)

*Primary Examiner* — Rudy Zervigon
(74) *Attorney, Agent, or Firm* — Weingarten, Schurgin, Gagnebin & Lebovici LLP

(57) ABSTRACT

To densify thin porous substrates (1) by chemical vapor infiltration, the invention proposes using loading tooling (10) comprising a tubular duct (10) disposed between first and second plates (12, 13) and around which the thin substrates for densification are disposed radially. The tooling as loaded in this way is then placed inside a reaction chamber (20) in an infiltration oven having a reactive gas admission inlet (21) connected to the tubular duct (11) to enable a reactive gas to be admitted into the duct which distributes the gas along the main faces on the substrates (1) in a flow direction that is essentially radial. The reactive gas can also flow in the opposite direction, i.e. it can be admitted into the tooling (10) from its outer envelope (16) and can be removed via the duct (11).

12 Claims, 9 Drawing Sheets

U.S. PATENT DOCUMENTS

| | | | |
|---|---|---|---|
| 4,282,267 A * | 8/1981 | Kuyel | 427/568 |
| 4,421,786 A * | 12/1983 | Mahajan et al. | 117/101 |
| 4,926,793 A * | 5/1990 | Arima et al. | 118/730 |
| 4,976,996 A * | 12/1990 | Monkowski et al. | 427/255.5 |
| 5,221,354 A * | 6/1993 | Rigney | 118/725 |
| 5,281,274 A * | 1/1994 | Yoder | 118/697 |
| 5,338,362 A * | 8/1994 | Imahashi | 118/719 |
| 5,747,113 A * | 5/1998 | Tsai | 427/255.5 |
| 5,807,792 A * | 9/1998 | Ilg et al. | 438/758 |
| 5,904,957 A * | 5/1999 | Christin et al. | 427/248.1 |
| 6,634,314 B2 | 10/2003 | Hwang et al. | 118/723 R |
| 6,669,988 B2 * | 12/2003 | Daws et al. | 427/249.2 |
| 6,793,966 B2 * | 9/2004 | Warnes et al. | 427/248.1 |
| 6,872,421 B2 * | 3/2005 | Hwang et al. | 427/248.1 |
| 6,911,234 B2 * | 6/2005 | Warnes et al. | 427/248.1 |
| 6,942,893 B2 * | 9/2005 | Delperier et al. | 427/237 |
| 6,953,605 B2 * | 10/2005 | Sion et al. | 427/248.1 |
| 6,972,055 B2 * | 12/2005 | Sferlazzo | 118/719 |
| 7,060,134 B2 * | 6/2006 | Chang | 118/728 |
| 7,182,980 B2 * | 2/2007 | Goujard et al. | 427/249.3 |
| 7,335,397 B2 * | 2/2008 | Rudolph et al. | 427/248.1 |
| 7,476,419 B2 * | 1/2009 | Rudolph et al. | 427/249.2 |
| 7,691,440 B2 * | 4/2010 | Bernard et al. | 427/248.1 |
| 7,691,443 B2 * | 4/2010 | Rudolph et al. | 427/249.2 |
| 2002/0076491 A1 * | 6/2002 | Delperier et al. | 427/248.1 |
| 2003/0098372 A1 * | 5/2003 | Kim | 239/548 |
| 2004/0071877 A1 * | 4/2004 | Goujard et al. | 427/255.28 |
| 2004/0237898 A1 * | 12/2004 | Bernard et al. | 118/724 |
| 2008/0124462 A1 * | 5/2008 | Waghray et al. | 427/249.2 |
| 2008/0152803 A1 * | 6/2008 | Lamouroux et al. | 427/248.1 |
| 2010/0260935 A1 * | 10/2010 | Kato et al. | 427/255.28 |

FOREIGN PATENT DOCUMENTS

| | | | |
|---|---|---|---|
| JP | 63150912 A | * | 6/1988 |
| JP | 03193879 A | * | 8/1991 |
| JP | 2002241938 A | * | 8/2002 |
| WO | WO 96/15285 | * | 5/1996 |
| WO | WO 9817599 A1 | * | 4/1998 |

* cited by examiner

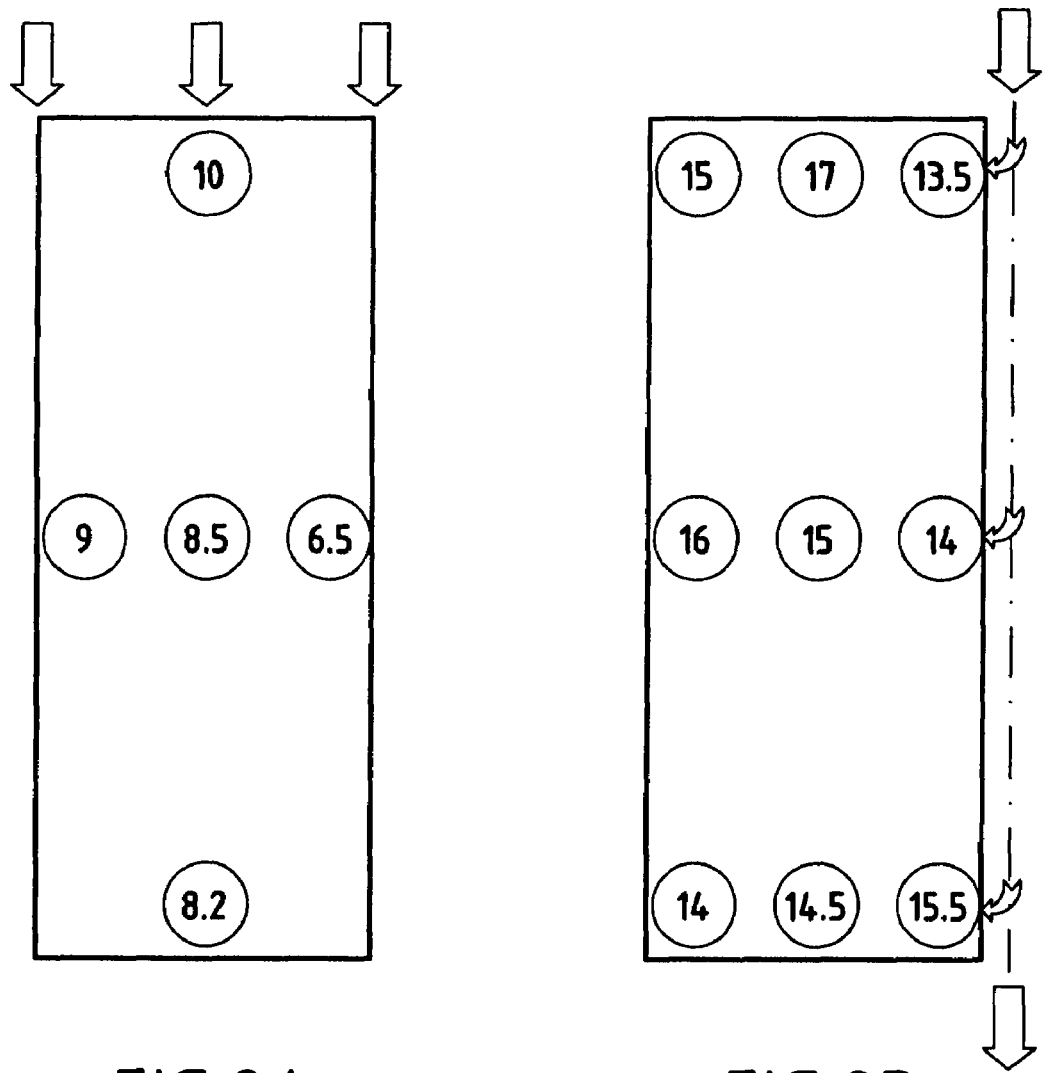

METHOD OF DENSIFYING THIN POROUS SUBSTRATES BY CHEMICAL VAPOR INFILTRATION, AND A LOADING DEVICE FOR SUCH SUBSTRATES

This application is a §371 national phase filing of PCT/FR2006/050141 filed Feb. 16, 2006, and claims priority to French application No. 05 01615 filed Feb. 17, 2005.

BACKGROUND OF THE INVENTION

The present invention relates to the techniques of chemical vapor infiltration that are used in particular when making parts out of thermostructural composite material. The invention relates more particularly to densifying thin porous substrates by deposing a matrix, i.e. densifying substrates that present thicknesses that are relatively small compared with their main dimensions.

In order to fabricate parts out of composite material, in particular parts made out of thermostructural composite material constituted by a refractory fiber preform (e.g. made of carbon or ceramic fibers) that is densified by a refractory matrix (e.g. of carbon or ceramic), it is common practice to make use of chemical vapor infiltration methods. Examples of such parts are thruster nozzles made of carbon-carbon (C—C) composite, or brake disks, in particular for airplane brakes, likewise made of C-C composite.

Densifying porous substrates by chemical vapor infiltration consists in placing the substrates in a reaction chamber of an infiltration installation by using support tooling, and in admitting a reactive gas into the chamber, which gas contains one or more precursors of the material that is to be deposited within the substrates in order to densify them. Infiltration conditions, in particular the composition and the flow rate of the reactive gas, and also the temperature and the pressure within the chamber, are selected to enable the gas to diffuse within the accessible internal pores of the substrates so as to deposit the desired material therein by decomposing a constituent of the gas or by a reaction between a plurality of the constituents thereof. The reactive gas is usually preheated by being passed through a preheater zone situated in the reaction chamber and into which the reactive gas inlet opens out. That method corresponds to the free-flow chemical vapor infiltration method.

In an industrial installation for chemical vapor infiltration, it is common practice to load the reaction chamber with a plurality of substrates or preforms that are to be densified simultaneously so as to increase the yield of the densification method, and consequently increase the packing density with which reaction chambers are loaded. Nevertheless, using free-flow chemical vapor infiltration to densify a plurality of substrates in a common chamber leads to certain difficulties, in particular relating to the uniformity of the resulting densification. When densifying thin substrates, e.g. in the form of fine rectangular plates disposed longitudinally in a reaction chamber with a reactive gas being diffused in free flow from the top edge thereof, it has been found that densification gradients are present within the substrates and between substrates within a single chamber (dispersion), and that this arises in spite of the care with which infiltration conditions are controlled. These deposition gradients are due in particular to lack of control over the flow of reactive gas within the chamber (privileged flow paths appear), thus leading to premature depletion of reagents and consequently to dispersions in densification between those portions of the substrates that are closest to and those that are furthest from the gas admission points.

In addition to the observed lack of uniformity in deposition, the densification of thin substrates presently also requires the use of support tooling so as to limit the extent to which the parts deform as a result of the deposition gradient and/or of internal stresses in the material. The use of such tooling penalizes the density with which the chamber can be loaded.

Procedures and installations for densifying porous annular substrates by chemical vapor infiltration are described in particular in documents US 2004/237898 and U.S. Pat. No. 5,904,957. Nevertheless, those methods apply essentially to densifying substrates of annular shape disposed in stacks, and they are not adapted to densifying substrates presenting thin shapes.

OBJECT AND SUMMARY OF THE INVENTION

An object of the invention is to provide a method that enables thin porous substrates to be densified, i.e. substrates that present thickness that is small relative to the dimensions of their main faces, such as fine parts that are plane or curved, and to enable the substrates to be loaded at high density, while simultaneously reducing densification gradients in the substrates.

This object is achieved by a chemical vapor infiltration method for densifying thin porous substrates with a material that is deposited therein, the method comprising: loading substrates for densification inside a reaction chamber of an infiltration oven; admitting close to a first longitudinal end of the reaction chamber a reactive gas containing at least one precursor of the material to be deposited; and removing the residual gas through an outlet situated close to the longitudinal end of the reaction chamber opposite its first end, in which method, in accordance with the invention, the substrates are disposed radially around a longitudinal duct, the reactive gas then being distributed along the main faces of the substrates in a flow direction that is essentially radial.

Thus, the flow direction of the reactive gas along the substrates is controlled, and consequently so is the uniformity with which the substrates are densified. The distribution of the reactive gas takes place as close as possible to the faces of the substrates, thus making it possible to reduce local depletion in reactive gas of the kind that is observed when the substrates are close to one another and the flow is not directed. The amount of reactive species diffusing within the substrates is greater.

Consequently, the method of the invention makes it possible to densify thin porous substrates, while simultaneously increasing the quality of the parts obtained and the volume of the reaction chamber that can be loaded.

In addition, the reactive gas can be preheated prior to being distributed along the substrates. In this way, the preheater zone generally used in reaction chambers with free-flow methods is no longer necessary, thus making it possible to further increase the volume of the chamber that can be loaded.

The reactive gas can be distributed from the duct, i.e. close to the inside edges of the substrates, and it can be removed from close to the outside edges of the substrates. Conversely, the reactive gas admitted into the chamber can be distributed from the outside edges of the substrates and can be removed from the inside of the longitudinal duct. Either way, the gas flows along the main faces of the substrates in a flow direction that is essentially radial.

When the reactive gas is distributed from the duct, the radial configuration of the substrates provides a local distribution of substrates that matches the depletion of the gas as it flows along the faces thereof. On leaving the duct, the gas presents its richest composition, and it is then in the zone where the substrates are loaded with the greatest packing density. Thereafter the gas becomes depleted as it travels along the faces of the substrates that spread out progressively relative to one another, thereby reducing the local packing density. This mutual compensation can be useful when the reactive gas presents a starting composition that is already low in reactive species.

Wedge-shaped inserts may be disposed between pairs of adjacent substrates so as to encourage the reactive gas to flow as close as possible to the faces of the substrates.

As a function of the internal dimensions of the reaction chamber, it is possible to superpose and/or juxtapose a plurality of series of substrates in the internal volume of the chamber. In each stack, the longitudinal ducts communicate with one another to form a single channel for distributing or removing the reactive gas.

With substrates of small dimensions, one or more additional rows of substrates can be juxtaposed, each substrate of the additional row then lying in the same radial plane as the substrate of the adjacent row so as to avoid disturbing the radial flow of the reactive gas.

The invention also seeks to provide loading tooling that enables the above-defined method to be implemented.

This object is achieved by a loading device comprising a tubular duct disposed between first and second plates, the tubular duct opening out in the surface of at least one of the plates in order to enable a reactive gas to be admitted to or removed from said duct, each plate including means for holding the substrates in a radial position around said duct, the tubular duct having a plurality of orifices for distributing or removing the reactive gas along the main faces of the substrates in a flow direction that is essentially radial.

Once placed in a reaction chamber, the device acts as a mini-reactor in which the flow of gas is controlled as described above. With this device, the load of substrates can be prepared in advance away from the densification installation, and is easily transported without risk to the reaction chamber. Thus, the time required for loading/unloading reaction chambers is reduced.

The orifices of the tubular duct are preferably disposed so as to distribute or remove the reactive gas as close as possible to the faces of the substrates.

According to an aspect of the invention, the device further comprises an outer cylindrical envelope surrounding the substrates and disposed concentrically about the tubular duct, the envelope including a plurality of orifices for removing or distributing the reactive gas. The orifices of the cylindrical envelope are preferably disposed as close as possible to the outer edges of the substrates in order to encourage the reactive gas to flow as close as possible to the faces of the substrates.

Each of the first and second plates includes means for holding the substrates radially in position around the tubular duct. These means may be constituted in particular by slideways or by rings provided with notches in which the substrates are engaged.

The invention also seeks to provide an installation enabling thin porous substrates to be densified uniformly by chemical vapor infiltration, and to do so with a high loading capacity.

This object is achieved by an installation comprising a reaction chamber within which there is a zone for loading substrates for densification, a susceptor defining the chamber and associated with heater means, an admission inlet for reactive gas at a first longitudinal end of the chamber, and a removal outlet situated close to the longitudinal end of the reaction chamber opposite from its first end, the installation being characterized in that the chamber comprises a plurality of thin porous substrates disposed in at least one loading device as described above, the tubular duct of the device being connected to the admission inlet or to the removal outlet for reactive gas of the chamber.

Depending on its dimensions, the chamber may comprise a plurality of loading devices stacked one on another, the tubular duct of one loading device co-operating with the tubular duct of the device on which it is stacked, and the tubular duct of the loading device situated at the top of the stack being connected to the reactive gas admission inlet or removal outlet of the chamber.

BRIEF DESCRIPTION OF THE DRAWINGS

Other characteristics and advantages of the invention appear from the following description of particular embodiments of the invention given as non-limiting examples, with reference to the accompanying drawings, in which:

FIGS. 8A and 8B show respectively the results obtained with a method of densification by chemical vapor infiltration using a free flow and using a method of densification by chemical vapor infiltration in accordance with the invention.

DETAILED DESCRIPTION OF AN IMPLEMENTATION

The chemical vapor infiltration method for densifying thin porous substrates in accordance with the invention makes use of specific tooling for loading purposes that are constructed and assembled as described below with reference to FIGS. 1A to 1C.

Figure 1A:
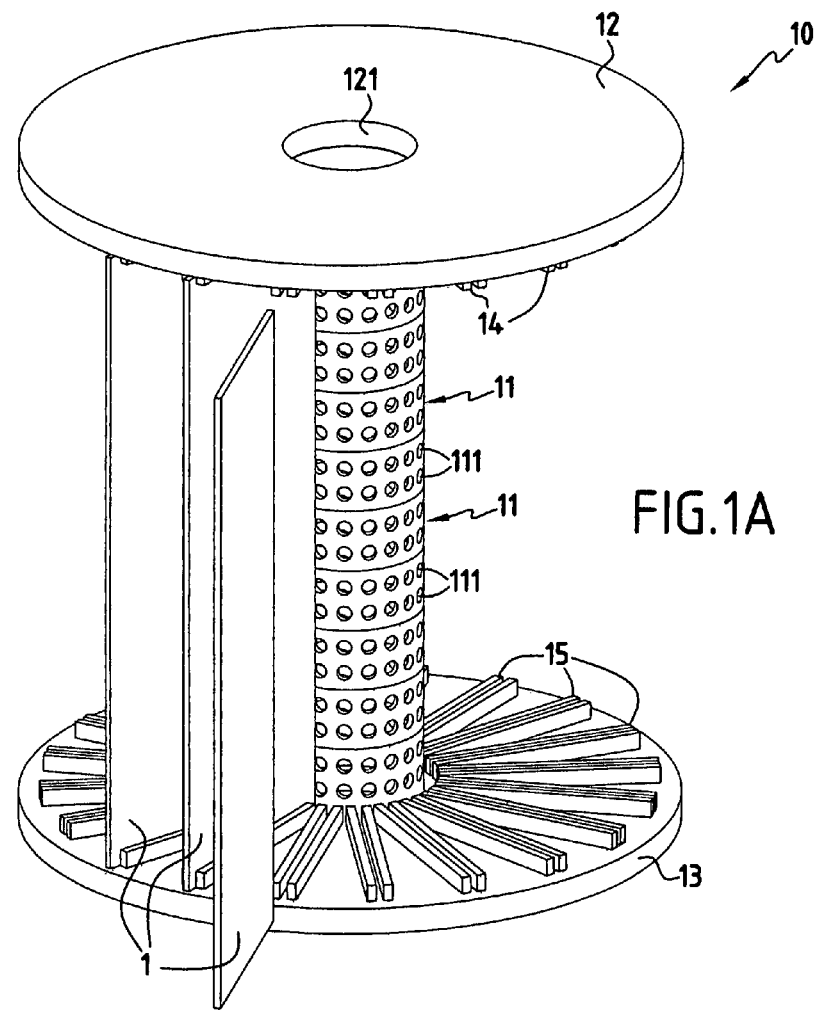
FIGS. 1A to 1C are perspective views of tooling used for loading and densifying thin porous substrates in accordance with the invention.

FIG. 1A shows a loading device or tool 10 at the beginning of the operation of loading substrates 1 that are to be densified, i.e. before the tooling is closed and inserted in a reaction chamber of an industrial chemical vapor infiltration installation. The tooling 10 comprises a vertical tubular duct 11 disposed between two circular plates 12 and 13. The top end of the duct 11 co-operates with a central opening 121 formed through the plate 12, and the bottom end of the duct 11 is closed by the plate 13. In a variant, the bottom end of the duct 11 could co-operate with a central opening formed through the plate 13, in particular to enable tooling devices to be superposed in a reaction chamber, as explained below.

Figure 2:
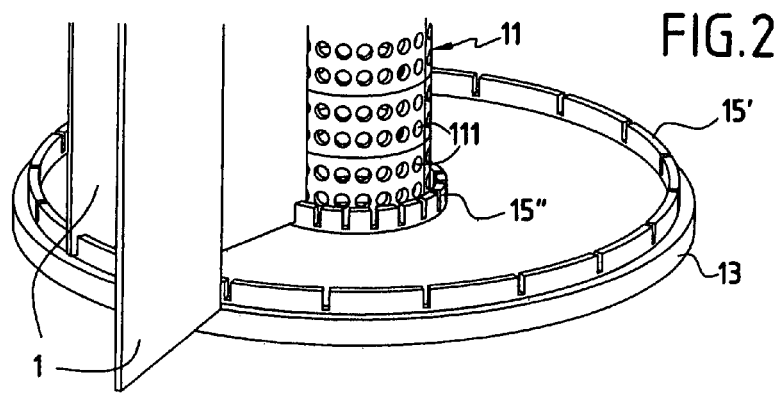
FIG. 2 is a perspective view of a portion of the FIG. 1A tooling showing a variant embodiment of the means for holding and positioning substrates.

The facing side faces of the plates 12 and 13 have respective holding and positioning means that are to receive the substrates for densification. In this embodiment, shown in FIG. 1A, the plates 12 and 13 have respective pluralities of slideways 14 and 15 that are uniformly distributed radially around the duct 11. The substrates 1 for densifying are loaded one by one into the tooling, by engaging them in the slideways. Other devices can be used for holding the substrates in position. For example, as shown in FIG. 2, the slideways may be replaced by rings 15', 15" having notches in which the substrates are engaged. In another variant, the plates may be provided with riders optionally of different dimensions or adjustable in height for receiving substrates of different sizes. These devices may be fitted onto the plates or they may form integral portions thereof (bulk machining).

Figure 1B:
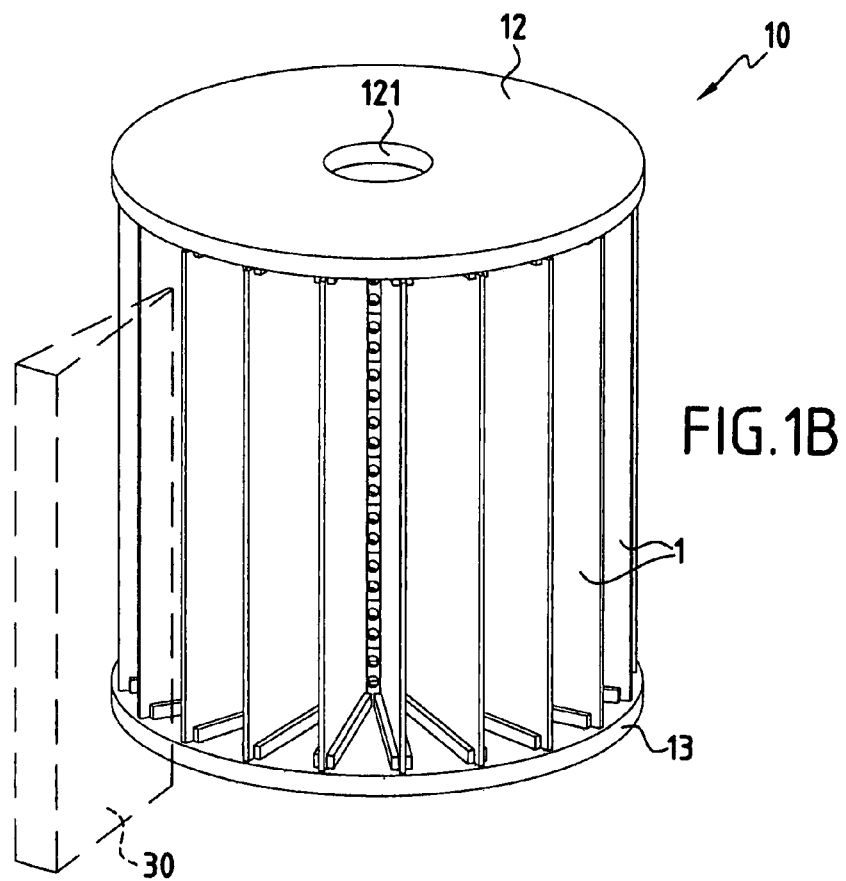
Figure 1C:
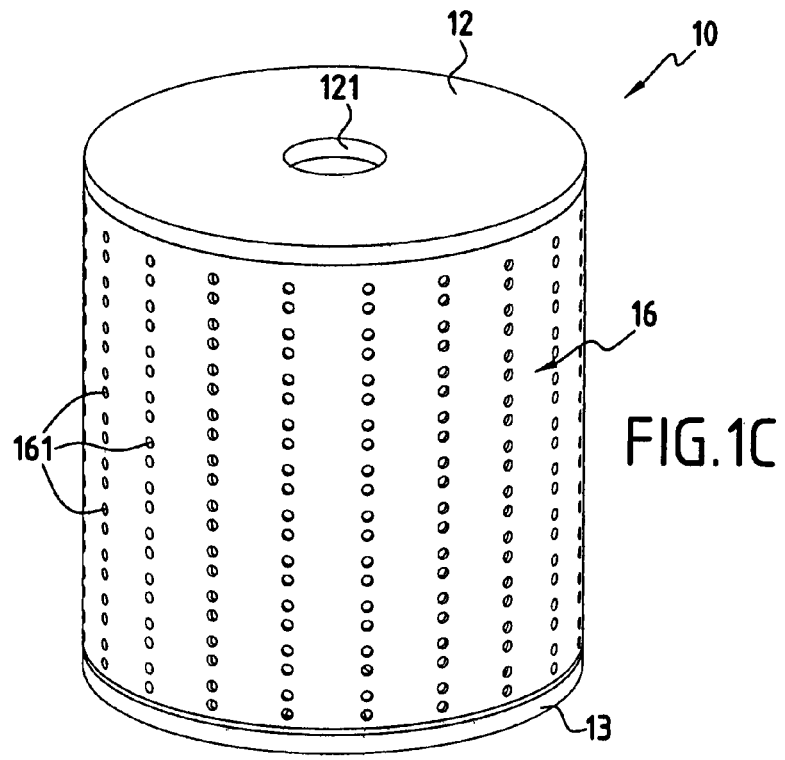

FIG. 1B shows the tooling 10 when all of the substrates 1 have been loaded. It can be seen that they are uniformly distributed radially around the duct 11. Once fully loaded, the tooling 10 is closed by a cylindrical envelope 16 as shown in FIG. 1C. The tooling 10 then forms a cell that protects the substrates. The substrates can thus be transported easily to the reaction chamber. All of the elements of the tooling 10 (plates, tubular duct, substrate holder means, cylindrical envelope, . . . ) are made for example of graphite, of expanded graphite, or of C/C composite material.

Optionally, wedge-shaped inserts 30 can be disposed between pairs of adjacent substrates so as to encourage the reactive gas to flow as close as possible to the faces of the substrates. Like the other elements of the tooling 10, the inserts 30 may be made for example out of graphite, of expanded graphite, or of a C/C composite material.

The duct 11 for delivering or removing the reactive gas as explained below has a plurality of orifices 111 for allowing the gas to pass through. These orifices 111 are preferably disposed in lines parallel to the axis of the tube, which lines are uniformly spaced apart from one another around the periphery of the duct, and the orifices on a given line are at constant spacing.

The cylindrical envelope 16 is also provided with orifices 161 to allow the gas to be removed from or delivered into the tooling and also to allow gas to flow within the reaction chamber. The number and angular positioning of the orifices 161 through the envelope 16 are preferably selected so as to be in alignment one to one with the orifices 111 in the duct 11.

The tubular duct 11 and the cylindrical envelope 16 may be made up of a plurality of sections connected end to end to provide a modular construction.

Figure 3:
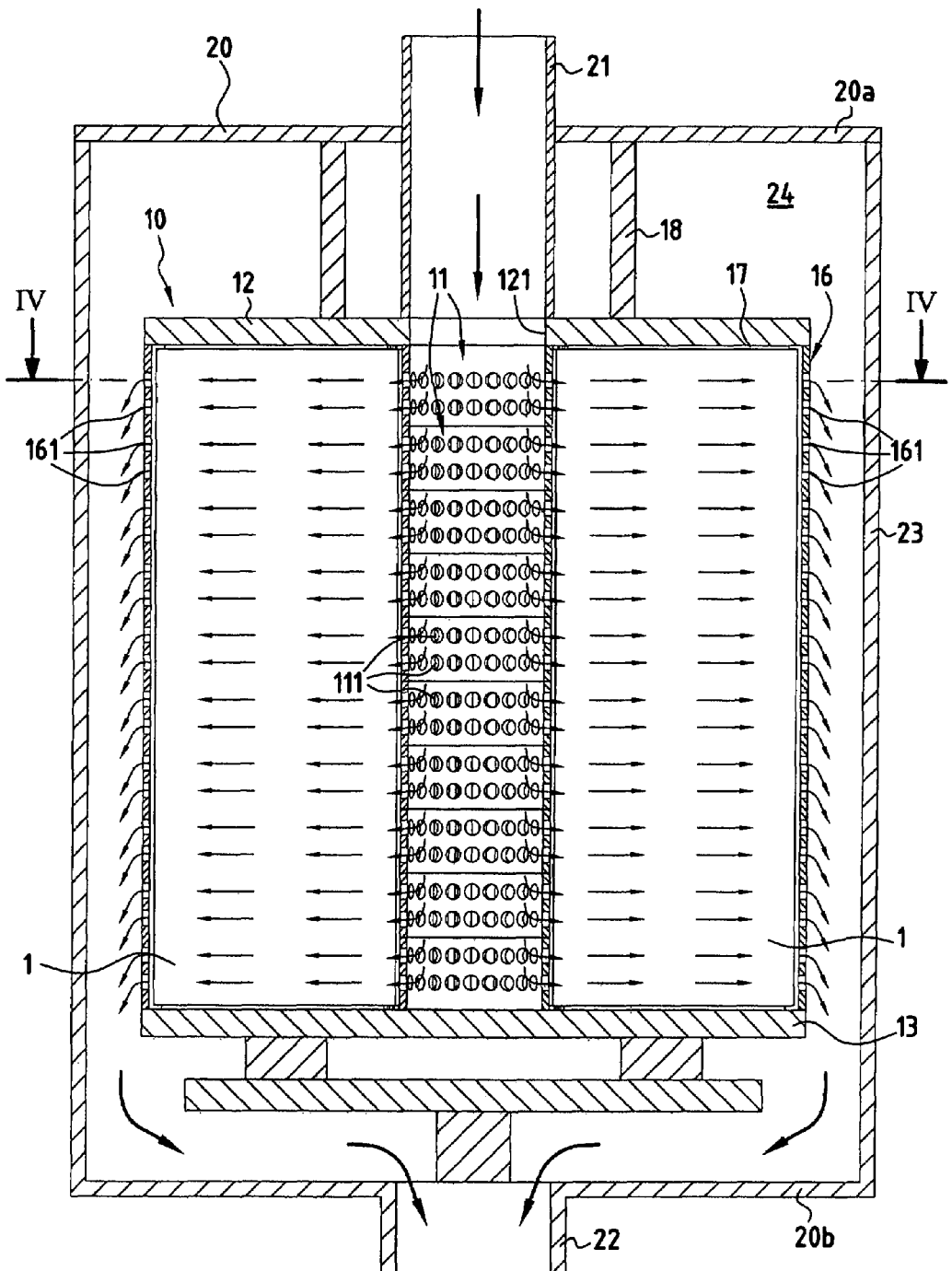
FIG. 3 is a diagrammatic section view showing an installation for densification by chemical vapor infiltration in which the substrates are loaded by means of tooling of the invention.

FIG. 3 is a diagram showing a reaction chamber 20 of an installation or oven for chemical vapor infiltration having substrates for densifying shown loaded therein. The chamber 20 is generally cylindrical in shape.

In order to densify the substrates 1, a reactive gas containing one or more precursors of the material of the matrix for deposition is introduced into the chamber 20. With carbon, for example, hydrocarbon gases are used, typically propane, methane, or a mixture of both. With a ceramic material, such as silicon carbide (SiC) for example, it is possible in well-known manner to use methyltricholorosilane (MTS) as a precursor for SiC.

In well-known manner, the porous substrates 1 are densified by depositing within them the matrix material as produced by decomposition of the precursor contained in the reactive gas diffusing inside the accessible internal pores of the substrates. The pressure and temperature conditions needed to deposit various matrices by chemical vapor infiltration are themselves well known.

In the example shown, the reactive gas is brought in by a pipe 21 that opens out into the top portion of the chamber. The residual gas is extracted from the bottom portion of the chamber via a pipe 22.

Heating inside the chamber is produced by a graphite susceptor 23 that is electromagnetically coupled with an induction coil (not shown). The susceptor 23 defines the inside volume 24 of the vertical axis chamber with the pipe 21 passing through the cover 20a and the pipe 22 passing through the bottom 20b. The bottom and the cover are likewise made of graphite.

Figure 4A:
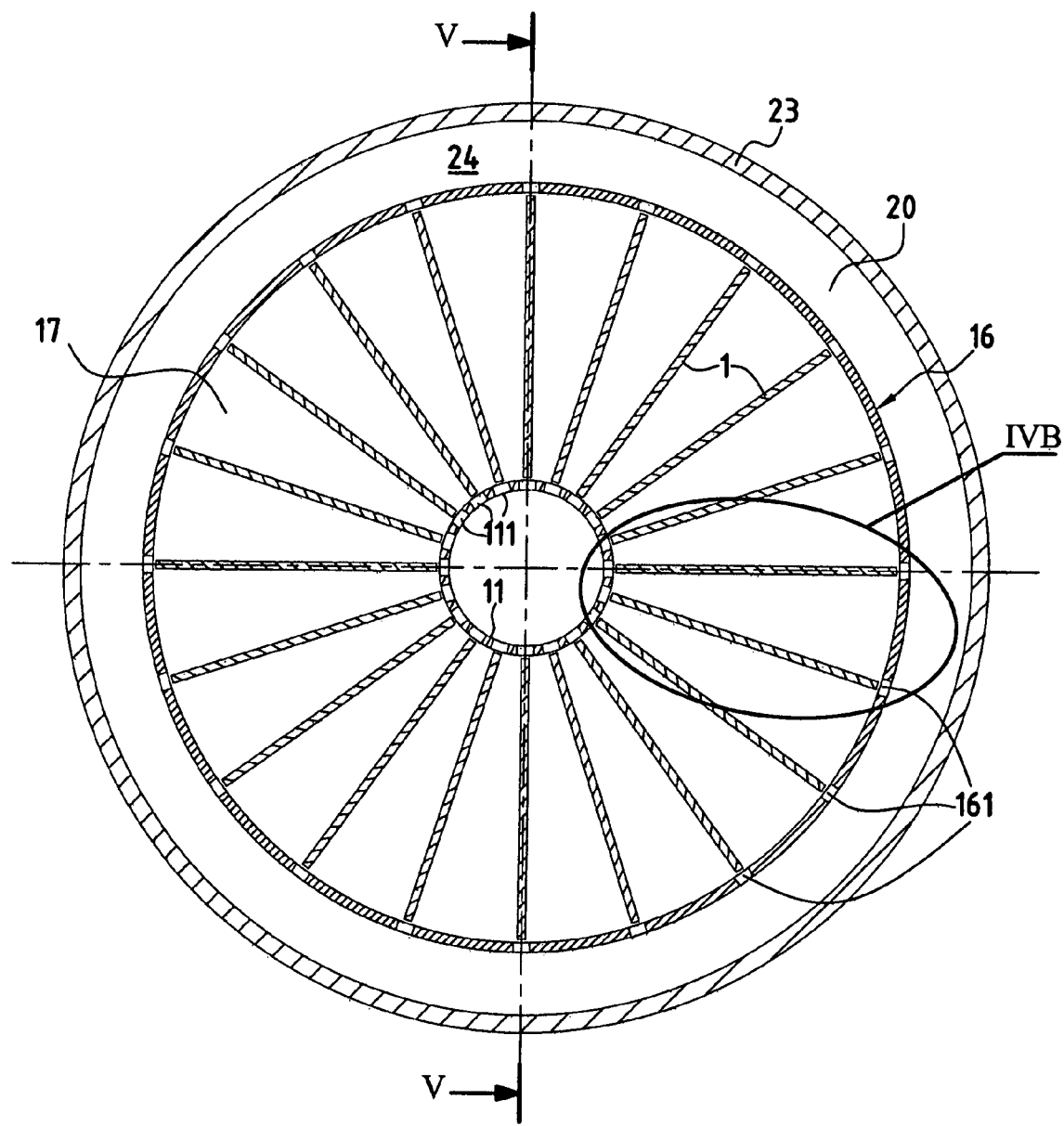
FIG. 4A is a section view of the FIG. 3 installation.

In order to densify thin porous substrates using a method in accordance with the invention, the substrates are loaded into the inside of the chamber 20 using the loading tooling 10 as described above. As shown in FIGS. 3 and 4A, the axis of the duct 11 coincides with the axis of the chamber so that the substrates 1 are disposed longitudinally along said axis and extend radially around it starting from the outside wall of the duct 11. The substrates are contained in an internal volume 17 defined between the duct 11, the envelope 16, and the plates 12 and 13, this volume defining the reaction zone for densifying the substrates.

The pipe 21 of the chamber is connected to the duct 11 of the tooling, which forms a preheating zone for the reactive gas prior to being distributed towards the substrates 1. A sleeve 18 for forming a preheater chamber may also be disposed on the top portion of the plate 12 around the opening 121. The preheated reactive gas is distributed in the internal volume 17 by passing through the orifices 111 in the duct 11 and passes through this internal volume 24 of the chamber by diffusing through the substrates 1 and passing through the orifices 161 of the envelope 16. The residual gas is extracted from the bottom 20B of the chamber through the pipe 22 which is connected to suction means (not shown).

Distributing the reactive gas by passing it through the orifices 111 of the duct 11 serves to ensure that the gas flows essentially radially in the reaction zone. By controlling the flow direction of the gas in this way relative to the shape of the substrates, it is possible to ensure that the gas becomes depleted in substantially uniform manner over the entire width of the substrates.

Figure 4B:
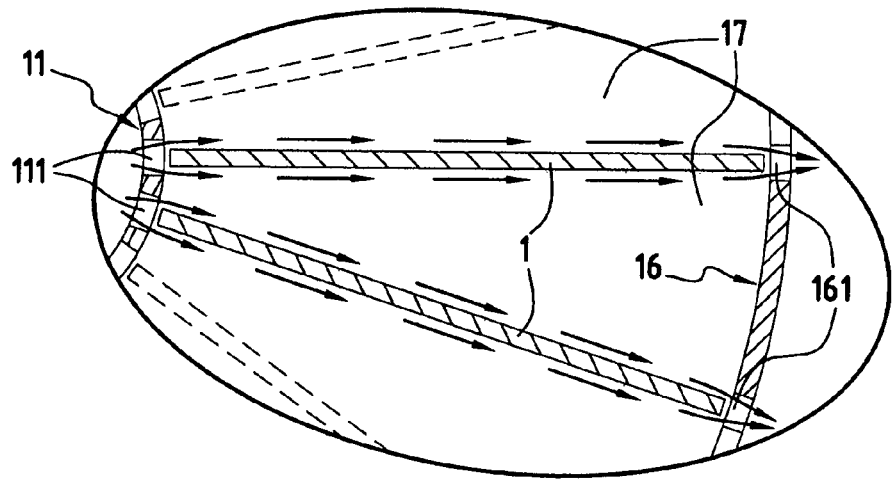
FIG. 4B is a detail view of a portion of FIG. 4A.

In addition, the loading tooling enables the reactive gas to be conveyed as close as possible to the substrates. As shown in FIGS. 4A and 4B, the reactive gas is distributed from the duct 11, passing through the orifices 111 that face or are close to the inside edges of the substrates. Similarly, the orifices 161 in the envelope 16 through which the gas is removed from the reactive zone are situated facing or close to the outside edges of the substrates. In this way, the flow of reactive gas takes place mainly along the walls of the substrates, thus serving to optimize the quantity of reactive species that are diffused within the substrates and serving to reduce the diffusion boundary layer. A pressure gradient may optionally be maintained between the duct 11 and the internal volume 17. Furthermore, head loss is controlled by the diameter of the orifices, which diameter may vary so as to achieve equilibrium between the flows within the reaction zone, where appropriate.

Figure 4C:
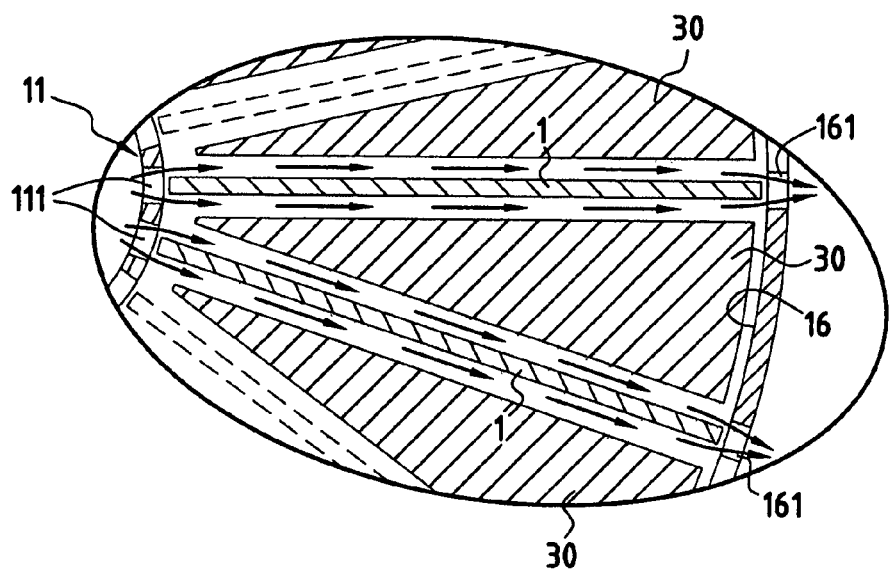
FIG. 4C shows the flow of reactive gas in the presence of inserts.

FIG. 4C shows the flow of reactive gas when the inserts 30 are placed between the substrates. The wedge-shape of the inserts 30 serves to reduce the volume between the substrates so as to encourage the reactive gas to flow as close as possible to the faces of the substrates.

Another advantage of the loading tooling is that it provides the possibility of achieving a good match between the composition of the reactive gas and the local packing density of the load. When the reactive gas is introduced via the tubular duct 11, i.e. the zone in which the local packing density is the greatest because the substrates are arranged radially (i.e. the substrates are very close together), the gas presents a composition that is rich in reagent. Consequently, prior to being depleted, the gas is distributed in the zone having the greatest density of substrates. Conversely, at the periphery of the tooling, the gas presents a composition that is depleted in reagent, since the reactive species have been consumed on passing through the reaction zone. This depletion is compensated by the local packing density being lower (the substrates diverge). This compensation is useful when the gas presents a starting composition in reactive species that is already low. The risks of premature depletion of reactive species from the gas can be eliminated by selecting a gas having a concentration in reactive species that is greater than that which is to be consumed during the infiltration process.

Figure 5:
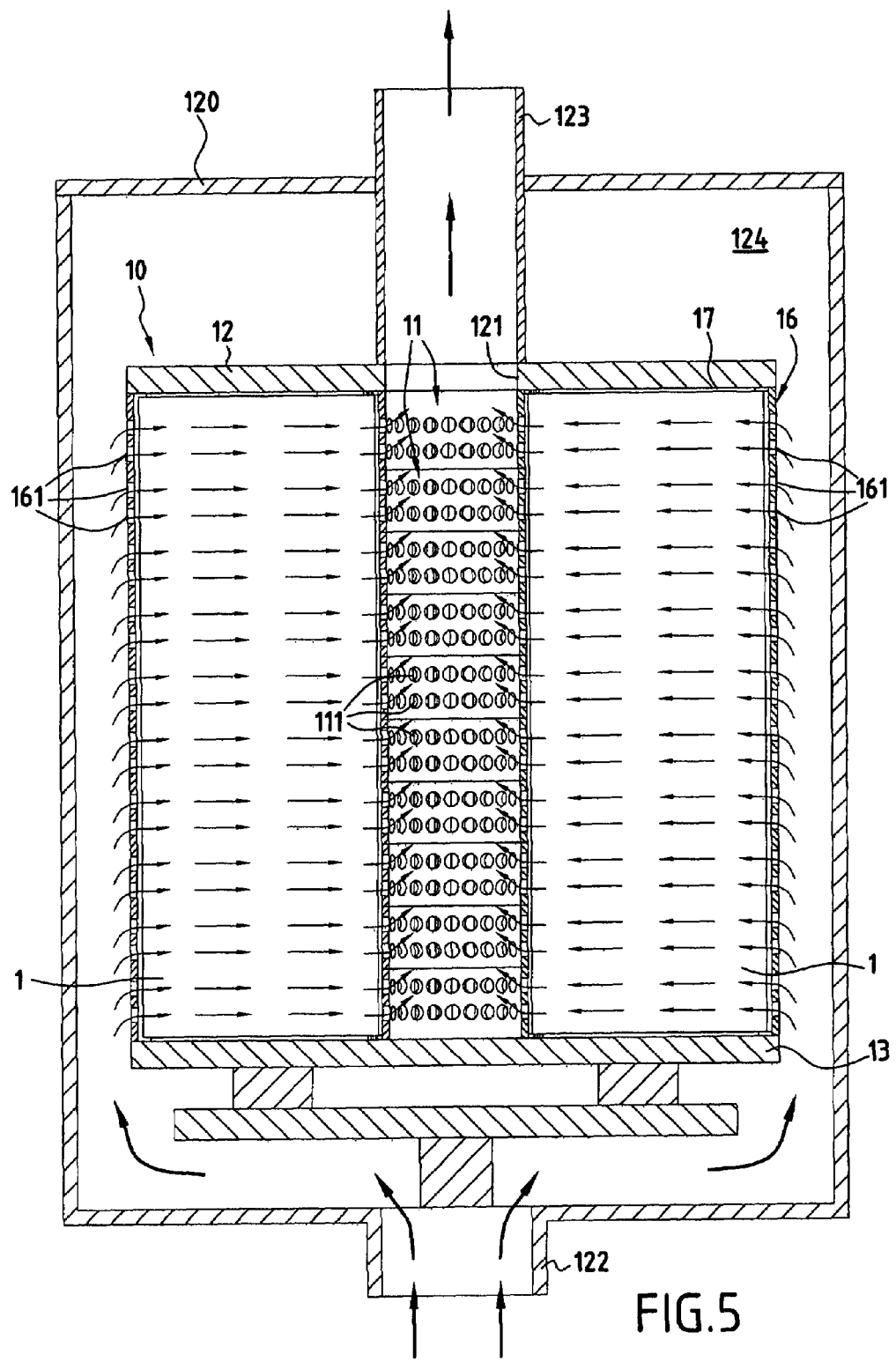
FIG. 5 is a diagrammatic section view showing an installation for densification by chemical vapor infiltration in which the flow of the reactive gas is reversed relative to the installation of FIG. 3.

In a variant implementation of the method of the invention, the reactive gas can be distributed from the outside edges of the substrates and evacuated by the tubular duct 11. Under such circumstances, as shown in FIG. 5, the loading tooling 10 is disposed inside a reaction chamber 120 that differs from the above-described chamber 20 in that the reactive gas is admitted into the internal volume 124 of the chamber by a pipe 122 and is removed by a pipe 123 that is connected to the duct 11 of the tooling 10. In this configuration, the reactive gas admitted into the chamber by the pipe 122 flows in the internal volume 124 of the chamber and penetrates into the internal volume 17 of the tooling through the orifices 161 in the envelope 16. The gas then flows along the faces of the substrates in a substantially radial direction. The gas is removed from the volume 17 via the duct 11 by passing through its orifices 111.

Thus, with the method of densification by chemical vapor infiltration of the invention, better infiltration of the substrate textures is achieved in comparison with free flow methods. FIGS. 8A and 8B show respectively the results obtained after densification by chemical vapor infiltration performed with a method of densification by chemical vapor infiltration in which the flow is free (FIG. 8A) and with a method of densification by chemical vapor infiltration in accordance with the invention (FIG. 8B). Tests were performed on identical substrates made up of woven carbon fiber texture in the form of plane rectangular parts (230 mm×110 mm) of the "nozzle flap" type, with the composition of the deposits made in the substrates being the same. The numbers given on the substrates of FIGS. 8A and 8B represent the total thickness to the core (in μm) as measured at different locations on the substrates. It can be seen that the thickness to the core of the substrates in FIG. 8B (using the method of the invention) is on average considerably greater than the thickness to the core of the substrate in FIG. 8A (the free flow). Furthermore, the dispersion in densification is smaller in the substrate of FIG. 8B than in that of FIG. 8A.

Figure 6:
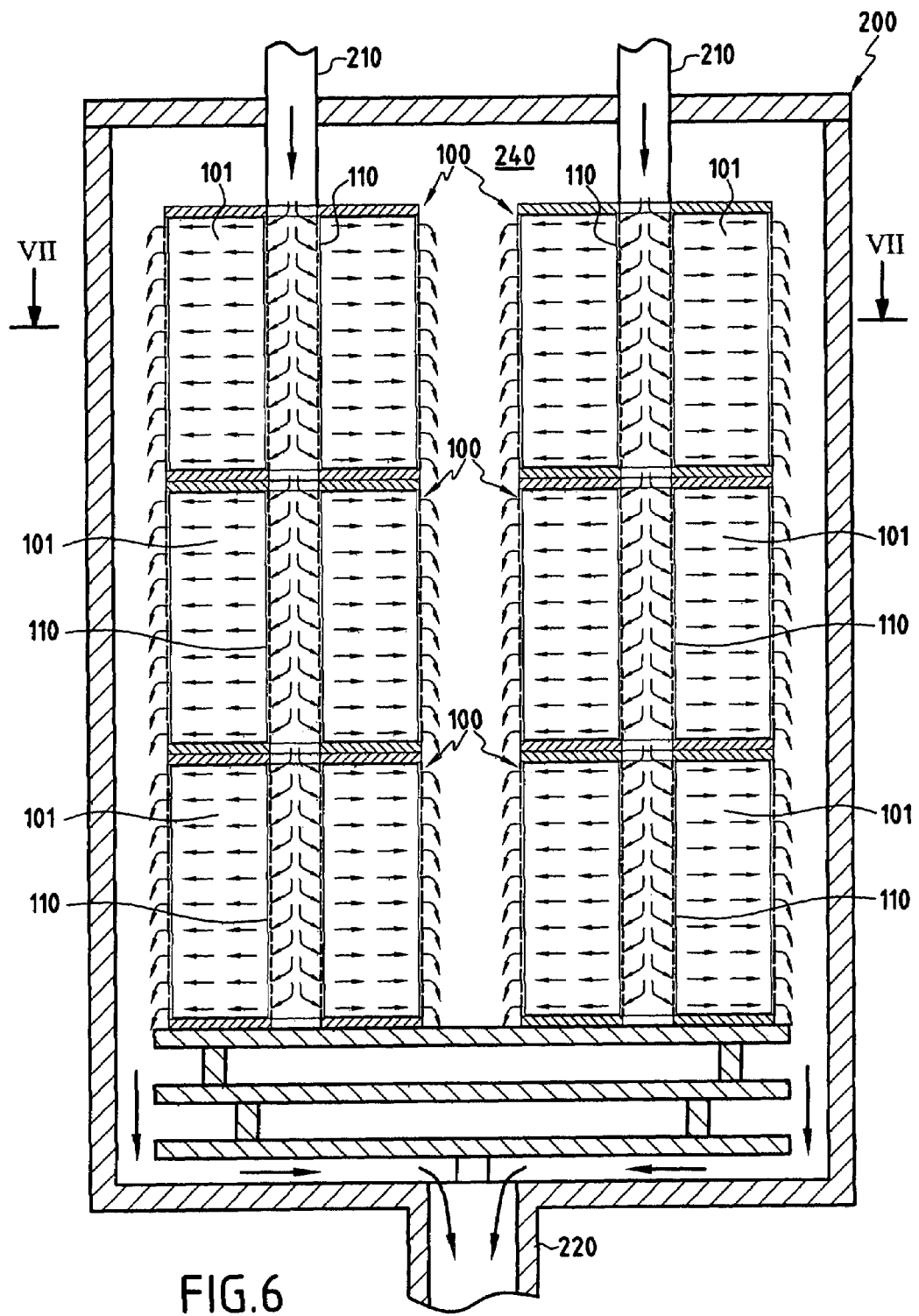
FIG. 6 is a diagrammatic section view showing an installation for densification by chemical vapor infiltration in which a plurality of tooling devices of the invention are superposed and juxtaposed.

The loading tooling behaves like a mini-reactor that enables the densification parameters to be optimized in independent manner. Consequently, when the capacity of the reaction chamber makes this possible, a plurality of tooling devices can be superposed and/or juxtaposed in a single chamber. FIG. 6 shows a reaction chamber 200 in which a plurality of tooling devices 100 are disposed in a plurality of stacks. In practice, the structure and the operation of the tooling devices 100 are similar to those of the tooling 10 described above. The difference is that the tubular duct 110 of the tooling 100 opens out to both sides of the tooling so that all of the ducts in a given stack co-operate from duct to duct to enable the reactive gas to be distributed through all of the reaction zones in the tooling devices. The device at the top of each stack is connected via the top end of its duct 110 to a pipe 210 for admitting reactive gas into the chamber. The residual gas is removed via the pipe 220 at the bottom of the chamber. Alternatively, as explained above with reference to FIG. 5, the flow direction of the reactive gas may be reversed so that it flows from the outside edges of the substrates towards their inside edges. Under such circumstances, the top end of the tooling duct at the top of the stack is connected to the removal pipe of the chamber.

With a multiple load made up of a plurality of tooling devices, the method is adapted merely by feeding reactive gas to each mini-reactor that is constituted by a tooling device. The reactive gas flow rates are merely multiplied by the number of tooling devices that need to be fed with gas. Furthermore, problems associated with flow in dead zones, as are encountered with free-flow methods in reaction chambers of large size, are eliminated by using the loading tooling devices of the invention.

Figure 7:
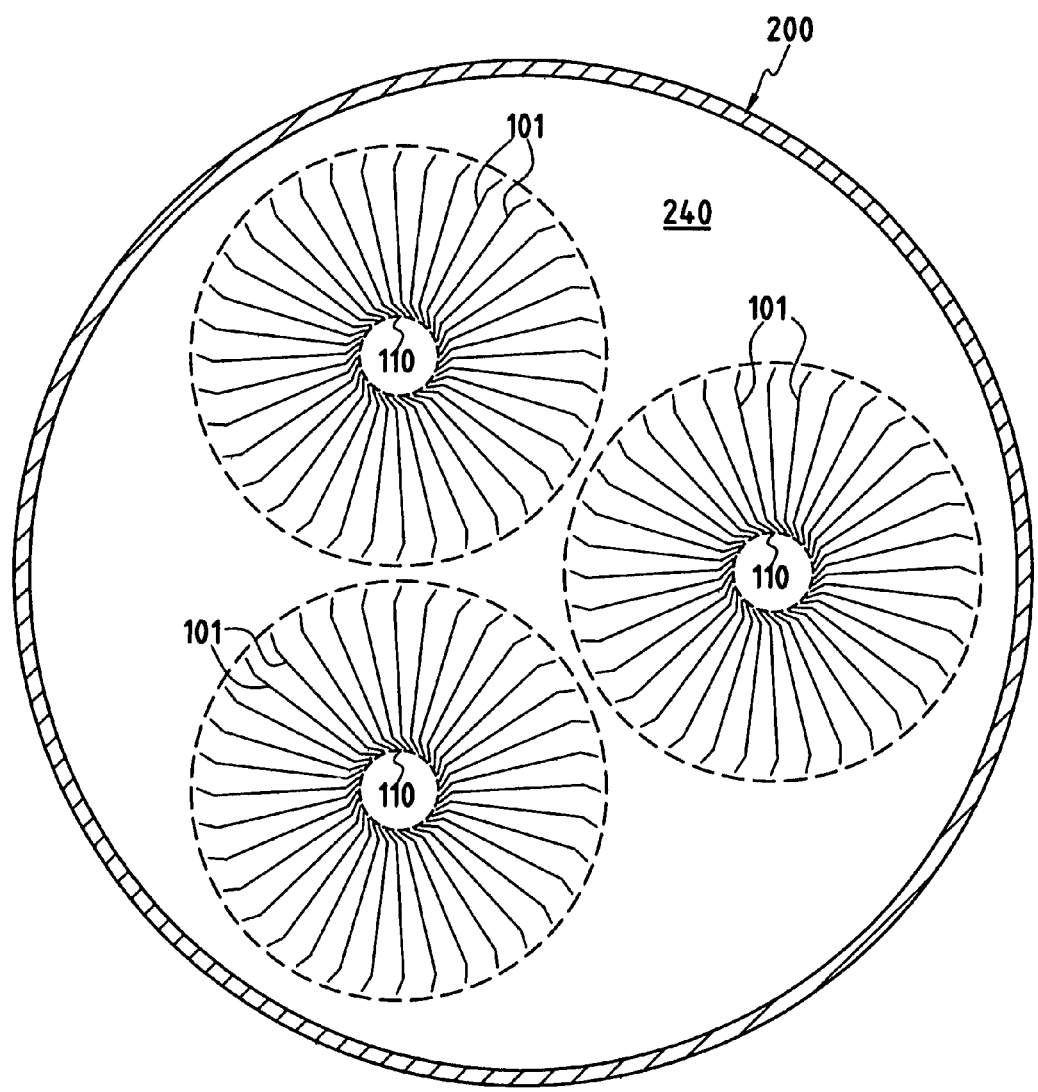
FIG. 7 is a section view of the FIG. 6 installation.

The method of densification of the invention by chemical vapor infiltration is particularly adapted to porous substrates or preforms that are thin in shape, i.e. of thickness that is small relative to their other dimensions (length/width of the faces). By way of example, such substrates may be parts that are rectangular or square, being substantially plane or presenting curves like the substrates 101 shown in FIGS. 6 and 7 which present drop edges at their ends. The densification method of the invention can be used in particular for fabricating thin parts of ceramic matrix composite (CMC) material such as nozzle flaps for aviation purposes.

The loading tooling of the invention also presents the advantage of enabling a load to be prepared in advance, i.e. away from the premises containing the infiltration oven, and for the substrates for densification to be transported to the reaction chamber with reduced risk, unlike the standard tooling conventionally used with a free flow. The time required for loading/unloading ovens for chemical vapor infiltration is thus reduced and handling is facilitated.

The preheating of the gas inside the duct of the tooling or in the internal volume of the chamber between the inside wall of the chamber and the outer envelope of the tooling makes it possible to omit a preheater zone as is conventionally used with free-flow chemical vapor infiltration methods. The working volume of the chamber is thus increased, thereby enabling the oven to be loaded with increased packing density.

The invention claimed is:

1. A loading device for densifying thin porous substrates by chemical vapor infiltration in a reaction chamber of an infiltration oven, the device comprising:

first and second plates, each of the first and the second plates having a side face in registration with and opposing the side face of the other plate with a space therebetween and each having corresponding slotted portions disposed on said side faces;

a tubular duct having an axis that coincides with an axis of the reaction chamber and that is disposed between the first and second plates, the tubular duct opening out in the space between the opposing side faces in order to enable a reactive gas to be admitted to or removed from said duct, wherein the slotted portions are structured and arranged for holding the substrates at points along a radial dimension outward from said tubular duct so that said substrates extend radially from the tubular duct and along substantially the entire vertical extent of the tubular duct, and wherein the tubular duct includes a plurality of orifices for distributing or removing the reactive gas along the main faces of the substrates in a flow direction that is essentially radial.

2. A device according to claim 1, characterized in that the orifices in the tubular duct are disposed in such a manner as to distribute or remove the reactive gas along the faces of the substrates.

3. A device according to claim 1, characterized in that it further includes an outer cylindrical envelope surrounding the substrates and disposed concentrically about the tubular duct, the envelope including a plurality of orifices for removing or distributing the reactive gas.

4. A device according to claim 3, characterized in that the orifices in the cylindrical envelope are disposed adjacent to the outside edges of the substrates.

5. A device according to claim 1, characterized in that it further includes wedge-shaped inserts disposed between the substrates.

6. A device according to claim 1, characterized in that each of the first and second plates has a plurality of slideways disposed radially about the tubular duct and in which the substrates are engaged.

7. A device according to claim 1, characterized in that each of the first and second plates has two concentric rings with equivalent numbers of notches radially aligned in pairs, in which the substrates are engaged.

8. An installation for densifying thin porous substrates by chemical vapor infiltration, the installation comprising a reaction chamber within which there is a zone for loading substrates for densification, a susceptor defining the chamber and associated with heater means, an admission inlet for reactive gas at a first longitudinal end of the chamber, and a removal outlet situated close to the longitudinal end of the reaction chamber opposite from its first end, the installation being characterized in that the chamber comprises a plurality of thin porous substrates disposed in at least one loading device according to claim 1, the tubular duct of the device being connected to the admission inlet or to the removal outlet for reactive gas of the chamber.

9. An installation according to claim 8, characterized in that the chamber contains a plurality of loading devices stacked one on another, the tubular duct of one loading device co-operating with the tubular duct of the device on which it is stacked, and the tubular duct of the loading device situated at the top of the stack being connected to the reactive gas admission inlet or removal outlet of the chamber.

10. An installation according to claim 8, characterized in that the chamber contains a plurality of juxtaposed loading devices, the tubular duct of each loading device being connected to a reactive gas admission inlet or removal outlet of the chamber.

11. A device according to claim 2, characterized in that:
it further includes an outer cylindrical envelope surrounding the substrates and disposed concentrically about the tubular duct, the envelope including a plurality of orifices for removing or distributing the reactive gas;
the orifices in the cylindrical envelope are disposed adjacent to the outside edges of the substrates;
it further includes wedge-shaped inserts disposed between the substrates;
each of the first and second plates has a plurality of slideways disposed radially about the tubular duct and in which the substrates are engaged;
each of the first and second plates has two concentric rings with equivalent numbers of notches radially aligned in pairs, in which the substrates are engaged.

12. An installation for densifying thin porous substrates by chemical vapor infiltration, the installation comprising a reaction chamber within which there is a zone for loading substrates for densification, a susceptor defining the chamber and associated with heater means, an admission inlet for reactive gas at a first longitudinal end of the chamber, and a removal outlet situated close to the longitudinal end of the reaction chamber opposite from its first end, the installation being characterized in that:
the chamber comprises a plurality of thin porous substrates disposed in at least one loading device according to claim 11, the tubular duct of the device being connected to the admission inlet or to the removal outlet for reactive gas of the chamber;
the chamber contains a plurality of loading devices stacked one on another, the tubular duct of one loading device co-operating with the tubular duct of the device on which it is stacked, and the tubular duct of the loading device situated at the top of the stack being connected to the reactive gas admission inlet or removal outlet of the chamber;
the chamber contains a plurality of juxtaposed loading devices, the tubular duct of each loading device being connected to a reactive gas admission inlet or removal outlet of the chamber.

\* \* \* \* \*